United States Patent
Huang et al.

(10) Patent No.: US 10,948,533 B2
(45) Date of Patent: Mar. 16, 2021

(54) TEST DEVICE FOR A TO-CAN LASER AND TEST SYSTEM FOR A TO-CAN LASER

(71) Applicant: O-NET COMMUNICATIONS (SHENZHEN) LIMITED, Shenzhen (CN)

(72) Inventors: Zining Huang, Shenzhen (CN); Bouchaib Hraimel, Shenzhen (CN); Jiaxi Kan, Shenzhen (CN)

(73) Assignee: O-NET COMMUNICATIONS (SHENZHEN) LIMITED, Shenzhen (CN)

( * ) Notice: Subject to any disclaimer, the term of this patent is extended or adjusted under 35 U.S.C. 154(b) by 262 days.

(21) Appl. No.: 16/292,390

(22) Filed: Mar. 5, 2019

(65) Prior Publication Data

US 2019/0302171 A1 Oct. 3, 2019

Related U.S. Application Data

(63) Continuation of application No. PCT/CN2018/103648, filed on Aug. 31, 2018.

(30) Foreign Application Priority Data

Mar. 29, 2018 (CN) .......................... 201810273567.4

(51) Int. Cl.
*G01R 31/26* (2020.01)

(52) U.S. Cl.
CPC ..... *G01R 31/2635* (2013.01); *G01R 31/2601* (2013.01)

(58) Field of Classification Search
CPC .......................... G01R 31/26; G01R 31/2635; G01R 31/2601; G01R 1/04; G01R 1/0408; G01R 1/045
See application file for complete search history.

(56) References Cited

U.S. PATENT DOCUMENTS

| | | | |
|---|---|---|---|
| 2004/0202432 A1* | 10/2004 | Baek | H05K 1/0243 385/88 |
| 2017/0023635 A1* | 1/2017 | Kwon | H01L 24/45 |
| 2018/0375288 A1* | 12/2018 | Benzoni | H01S 5/026 |

FOREIGN PATENT DOCUMENTS

JP 2004381733 * 7/2002 ............. G01N 33/53

* cited by examiner

*Primary Examiner* — Son T Le

(57) ABSTRACT

A test device for a TO-CAN laser includes a test socket, a coaxial waveguide substrate, and a test printed circuit board (PCB). The test socket comprises a coaxial waveguide tube accommodating a signal output pin of the TO-CAN laser and an electric-conducting slot accommodating a signal input pin of the TO-CAN laser. The coaxial waveguide substrate is respectively connected with a coaxial waveguide pin of the test PCB and the coaxial waveguide tube of the test socket. An electric-conducting slot pin of the test socket is connected with corresponding control pins of the test PCB.

17 Claims, 2 Drawing Sheets

TEST DEVICE FOR A TO-CAN LASER AND TEST SYSTEM FOR A TO-CAN LASER

CROSS-REFERENCE TO RELATED APPLICATIONS

This is a continuation-application of International Application No. PCT/CN/CN2018/103648, with an international filing date of Aug. 31, 2018, which claims foreign priority to Chinese Patent Application No. 201810273567.4, filed on Mar. 29, 2018 in the State Intellectual Property Office of China, the contents of which are hereby incorporated by reference.

TECHNICAL FIELD

The present disclosure relates to a field of TO-CAN laser testing technology, and in particular to a test device for a TO-CAN laser and a test system for a TO-CAN laser.

BACKGROUND

TO-CAN laser is a laser diode module, in particular, to a coaxial type laser diode module. A housing of the TO-CAN laser is generally cylindrical and the TO-CAN laser is generally used in a 40 Gbit/s transmission system. At present, a most important use of the TO-CAN laser is for a short-distance transmission such as a 2.5 Gbit/s transmission and a 10 Gbit/s transmission. However, there is already coaxial cooling technology and with development of coaxial cooling technology, technologies of a 10 Gbit/s transmission and 20 km transmission have been initially available. Because of its low cost and simple process, prospect of the coaxial cooling technology is excellent.

In actual use, the TO-CAN laser needs to be tested and to obtain test information. However, when testing the TO-CAN laser, it is necessary to shorten its leads, which is not conducive to batch production and batch testing.

SUMMARY

An object of the present disclosure is to provide a test device for a laser diode module (TO-CAN laser) to solve the above defect, and solve a problem that the conventional test device is inefficient and is not conducive to batch production and batch testing.

An object of the present disclosure is to provide a test system for a TO-CAN laser to solve the above defect, and solve the problem that the conventional test device is inefficient and is not conducive to batch production and batch testing.

A technical solution to solve the technical problem thereof adopted by the present disclosure is to provide a test device for the TO-CAN laser. The test device comprises a test socket, a coaxial waveguide substrate, and a test printed circuit board (PCB). The test socket comprises a coaxial waveguide tube accommodating a signal output pin of the TO-CAN laser and an electric-conducting slot accommodating a signal input pin of the TO-CAN laser. A coaxial waveguide pin of the test PCB and the coaxial waveguide tube of the test socket are respectively connected with the coaxial waveguide substrate. An electric-conducting slot pin of the test socket is connected with corresponding control pins of the test PCB.

Furthermore, the coaxial waveguide substrate is a copper substrate.

Furthermore, the coaxial waveguide substrate further comprises a radio frequency (RF) ground pin. The RF ground pin is connected with a first ground pin of the test PCB.

Furthermore, the test socket comprises a socket barrel. An end face of the socket barrel defining a first through hole acting as an opening of the coaxial waveguide tube and a second through hole acting as a slot opening of the electric-conducting slot. The coaxial waveguide tube and the electric-conducting slot are arranged inside the socket barrel.

Furthermore, the test PCB comprises a main control processing circuit. The coaxial waveguide pin and a plurality of the control pins are connected with the main control processing circuit respectively.

Furthermore, the control pins of the PCB comprise a laser diode (LD) control pin, a thermo electric cooler (TEC) control pin and a second ground (GND) pin. The coaxial waveguide pin is a photo-diode (PD) control pin.

A technical solution to solve the technical problem thereof adopted by the present disclosure is to provide a test system for the TO-CAN laser. The test system comprises a test device and a test platform. The test platform acquires a text information of the TO-CAN laser from the test device and displays the test information.

Furthermore, the test information comprises one or more of a wavelength information of the TO-CAN laser, a threshold current information of the TO-CAN laser, an operating current information of the TO-CAN laser, and a monitoring current information of the TO-CAN laser.

Compared with the prior art, the present disclosure of the test device and the test system do not need to cut short leads of the TO-CAN laser, which facilitates batch production and batch testing, facilitates a comprehensive testing of TOCAN laser. In addition, a bandwidth is extended from direct current (DC) to approximately 60 GHz through the coaxial waveguide substrate.

BRIEF DESCRIPTION OF DRAWINGS

The present disclosure will be further described below in conjunction with the accompanying drawings and embodiments, wherein.

DETAILED DESCRIPTION

Figure 1:
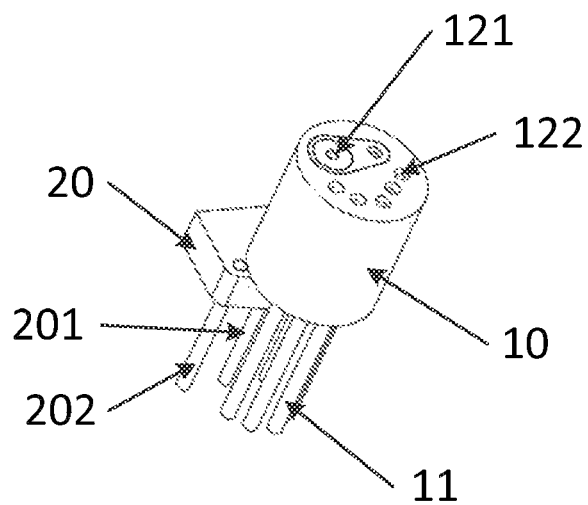
FIG. 1 is a schematic diagram showing a structure of a test device of the present disclosure.
Figure 2:
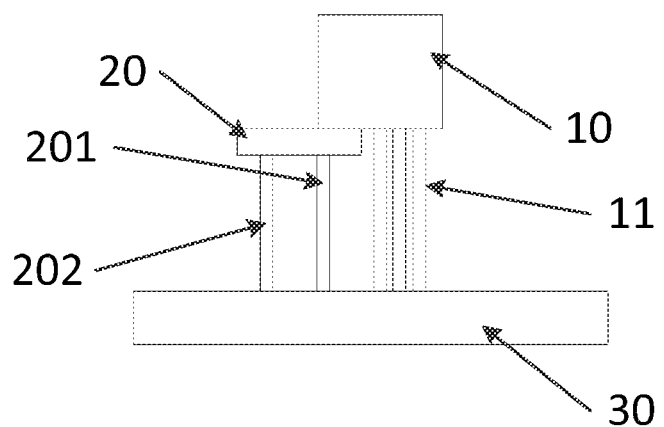
FIG. 2 is a schematic diagram showing a side structure of a test device of the present disclosure.
Figure 3:
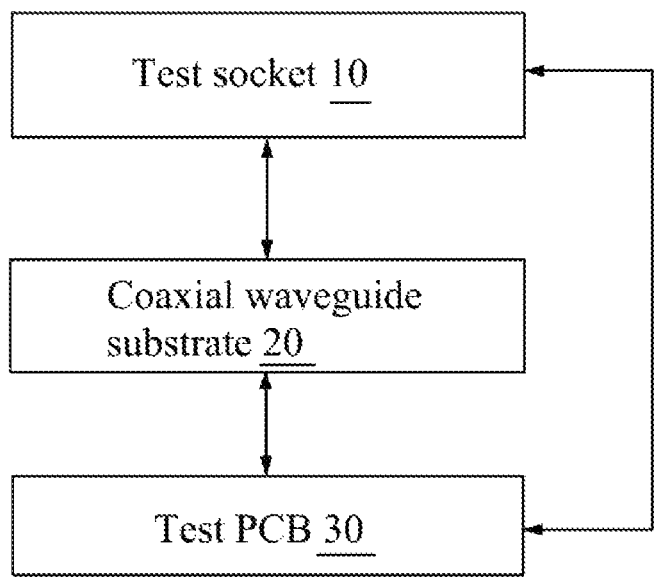
FIG. 3 is a structure diagram of a test device of the present disclosure.

The present disclosure will be further described herein in conjunction with the accompanying drawings and embodiments, As shown in FIG. 1 to FIG. 3, the present disclosure provides preferred embodiments of a test device for a TO-CAN laser (laser diode module).

The test device for the TO-CAN laser comprises a test socket 10, a coaxial waveguide substrate 20, and a test printed circuit board (PCB) 30. The test socket 10 comprises a coaxial waveguide tube accommodating a signal output pin of the TO-CAN laser and an electric-conducting slot accommodating a signal input pin of the TO-CAN laser. The coaxial waveguide substrate 20 is connected with a coaxial waveguide pin of the test PCB 30 and the coaxial waveguide tube of the test socket 10. The electric-conducting slot pin 11 of the test socket 10 is connected with corresponding control pins of the test PCB 30.

The coaxial waveguide substrate 20 is connected with the coaxial waveguide pin of the test PCB 30 through a coaxial waveguide pin 201 of the coaxial waveguide substrate 20.

To be specific, the TO-CAN laser comprises a laser diode (LD) pin (comprises a positive pin and a negative pin), a thermo electric cooler (TEC) pin (comprises a positive pin and a negative pin), a (photo-diode (PD) pin (comprises a positive pin and a negative pin), and a ground (GND) pin. The test socket 10 comprises the coaxial waveguide tube accommodating the above-mentioned pins and a plurality of electric-conducting slots. The coaxial waveguide tube accommodates a positive pin of the PD pin and the electric-conducting slots accommodate the other pins correspondingly. The control pins of the PCB 30 comprise an LD control pin, a TEC control pin and a second ground pin. The coaxial waveguide pin is a PD control pin.

In one embodiment, the coaxial waveguide substrate 20 is a copper substrate. A transmission method of a radio frequency (RF) signal in the test socket 10 is a coaxial coplanar waveguide. And a transmission from the test socket 10 to the test PCB 30 is transmitted through the coaxial coplanar waveguide method used by the copper substrate, which makes a bandwidth to extend from DC (direct current) to approximately 60 GHz and is available for evaluation of 10G-TOCAN EM transmitter products. The coaxial waveguide substrate 20 further comprises a RF ground pin 202. The RF ground pin 202 is connected with the first ground pin of the test PCB 30.

In one embodiment, the test socket 10 comprises a socket barrel. An end face of the socket barrel defining a first through hole 121 acting as an opening of the coaxial waveguide tube and a second through hole 122 acting as a slot opening of the electric-conducting slot. The coaxial waveguide tube and the electric-conducting slot are arranged inside the socket barrel.

The TO-CAN laser is inserted into the first through hole 121 of the socket barrel and the second through hole 122 of the socket barrel through pins of the TO-CAN laser. The socket barrel is connected with the coaxial waveguide substrate 20 and the test PCB 30 through the coaxial waveguide tube. The socket barrel is connected with the test PCB 30 through the electric-conducting slots.

In one embodiment, the test PCB 30 comprises a main control processing circuit. The coaxial waveguide pin and a plurality of the control pins are connected with the main control processing circuit respectively. To be specific, the main control processing circuit comprises a main control chip, and the coaxial waveguide pin and a plurality of the control pins are connected with the main control chip through leads.

Figure 4:
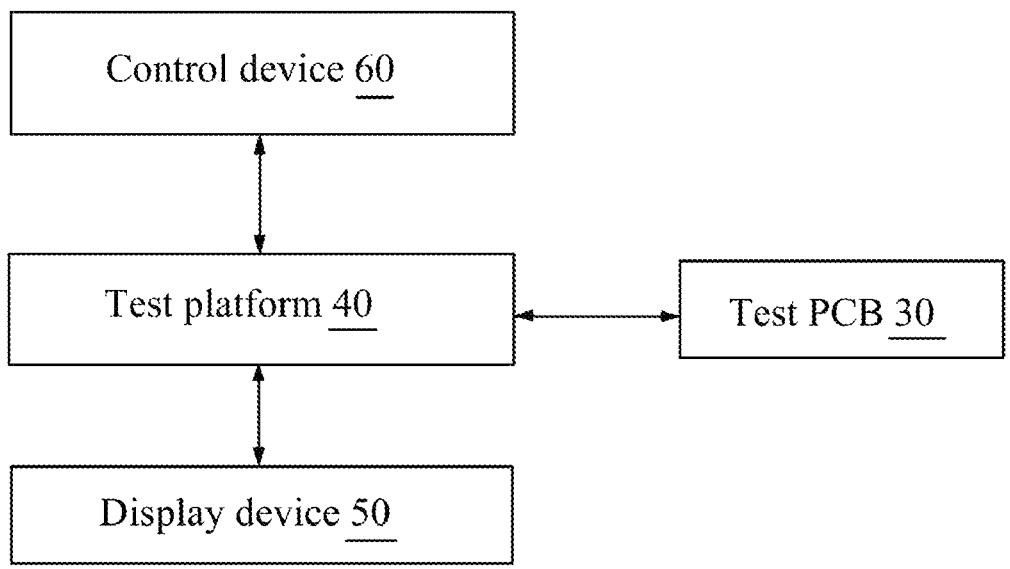
FIG. 4 is a structure diagram of a test system of the present disclosure.

As shown in FIG. 4, the present disclosure provides an embodiment of a test system for a TO-CAN laser.

The test system for the TO-CAN laser comprises a test device 1 and a test platform 40. The test platform 40 acquires a text information of the TO-CAN laser from the test device 1 and displays the test information.

To be specific, the test system comprises a display device 50 connected with the test platform 40. And the display device 50 displays relevant information. The display device 50 is selected from a displayer or other display instrument which facilitate intuitive acquisition of s test result. And, the test system also comprises a control device 60. The control device 60 is a computer or the like. The control device 60 is coupled to the test platform 40 to realize corresponding controls.

Furthermore, the test information comprises one or more of a wavelength information of the TO-CAN laser, a threshold current information of the TO-CAN laser, an operating current information of the TO-CAN laser, and a monitoring current information of the TO-CAN laser. The wavelength (nm) information of the TO-CAN laser is an operating wavelength of the TO-CAN laser. The threshold current (Ith) information of the TO-CAN laser is a current at which the laser diode starts to generate laser oscillations. For low power lasers, a value of the threshold current is about tens of milliamps. The operating current (Iop) of the TO-CAN laser is a driving current when the laser diode reaches a rated output power. A value of the operating current is important for designing and debugging the laser driving circuit. The monitoring current (Im) information of the TO-CAN laser is a current flowing through a PIN tube when the laser diode is at rated output power.

In the embodiment, according to a control of the test platform 40, implementation parameters of the TO-CAN laser placed on the test device 1 under various working environments are obtained, and a performance of the TO-CAN laser to be detected is detected.

The above are only prefer embodiments of the present disclosure, and are not intended to limit the scope of the present disclosure. Equivalent changes or modifications made according to the present disclosure are in the the scope of the present invention.

What is claimed is:
1. A test device for a TO-CAN laser, comprising:
   a test socket;
   a coaxial waveguide substrate; and
   a test printed circuit board (PCB);
   wherein the test socket comprises a coaxial waveguide tube accommodating a signal output pin of the TO-CAN laser and an electric-conducting slot accommodating a signal input pin of the TO-CAN laser; the coaxial waveguide substrate is connected with a coaxial waveguide pin of the test PCB and the coaxial waveguide tube of the test socket; an electric-conducting slot pin of the test socket is connected with corresponding control pins of the test PCB.

2. The test device according to claim 1, wherein the coaxial waveguide substrate is a copper substrate.

3. The test device according to claim 1, wherein the coaxial waveguide substrate further comprises a radio frequency (RF) ground pin, the RF ground pin is connected with a first ground pin of the test PCB.

4. The test device according to claim 2, wherein the coaxial waveguide substrate further comprises a radio frequency (RF) ground pin, the RF ground pin is connected with a first ground pin of the test PCB.

5. The test device according to claim 1, wherein the test socket comprises a socket barrel; an end face of the socket barrel, defining a first through hole, acting as an opening of the coaxial waveguide tube, and a second through hole acting as a slot opening of the electric-conducting slot; the coaxial waveguide tube and the electric-conducting slot are arranged inside the socket barrel.

6. The test device according to claim 2, wherein the test socket comprises a socket barrel; an end face of the socket barrel, defining a first through hole, acting as an opening of the coaxial waveguide tube, and a second through hole acting as a slot opening of the electric-conducting slot; the coaxial waveguide tube and the electric-conducting slot are arranged inside the socket barrel.

7. The test device according to claim 1, wherein the test PCB comprises a main control processing circuit, the coaxial waveguide pin and a plurality of the control pins are connected with the main control processing circuit respectively.

8. The test device according to claim 1, wherein the control pins comprise a laser diode (LD) control pin, a thermo electric cooler (TEC) control pin and a second ground (GND) pin; the coaxial waveguide pin is a photo-diode (PD) control pin.

9. A test system for the TO-CAN laser, comprising a test device and a test platform; wherein the test device comprises a test socket, a coaxial waveguide substrate, and a test PCB; the test socket comprises a coaxial waveguide tube accommodating a signal output pin of the TO-CAN laser and an electric-conducting slot accommodating a signal input pin of the TO-CAN laser; the coaxial waveguide substrate is connected with a coaxial waveguide pin of the test PCB and the coaxial waveguide tube of the test socket; an electric-conducting slot pin of the test socket is connected with corresponding control pins of the test PCB; the test platform acquires a text information of the TO-CAN laser from the test device and displays the test information.

10. The test system according to claim 9, wherein the test information comprises one or more of a wavelength information of the TO-CAN laser, a threshold current information of the TO-CAN laser, an operating current information of the TO-CAN laser, and a monitoring current information of the TO-CAN laser.

11. The test system according to claim 9, wherein the coaxial waveguide substrate is a copper substrate.

12. The test system according to claim 9, wherein the coaxial waveguide substrate further comprises a RF ground pin, the RF ground pin is connected with a first ground pin of the test PCB.

13. The test system according to claim 11, wherein the coaxial waveguide substrate further comprises a RF ground pin, the RF ground pin is connected with a first ground pin of the test PCB.

14. The test system according to claim 9, wherein the test socket comprises a socket barrel; an end face of the socket barrel, defining a first through hole, acting as an opening of the coaxial waveguide tube, and a second through hole acting as a slot opening of the electric-conducting slot; the coaxial waveguide tube and the electric-conducting slot are arranged inside the socket barrel.

15. The test system according to claim 11, wherein the test socket comprises a socket barrel; an end face of the socket barrel, defining a first through hole, acting as an opening of the coaxial waveguide tube, and a second through hole acting as a slot opening of the electric-conducting slot; the coaxial waveguide tube and the electric-conducting slot are arranged inside the socket barrel.

16. The test system according to claim 9, wherein the test PCB comprises a main control processing circuit, the coaxial waveguide pin and a plurality of the control pins are connected with the main control processing circuit respectively.

17. The test system according to claim 9, wherein the control pins comprise an LD control pin, a TEC control pin and a second GND pin; the coaxial waveguide pin is a photo-diode (PD) control pin.

* * * * *